United States Patent
Van De Kerkhof et al.

(10) Patent No.: US 10,216,093 B2
(45) Date of Patent: Feb. 26, 2019

(54) PROJECTION SYSTEM AND MINOR AND RADIATION SOURCE FOR A LITHOGRAPHIC APPARATUS

(71) Applicant: ASML Netherlands B.V., Veldhoven (NL)

(72) Inventors: Marcus Adrianus Van De Kerkhof, Veldhoven (NL); Anton Bernhard Van Oosten, Veldhoven (NL); Hans Butler, Best (NL); Erik Roelof Loopstra, Eindhoven (NL); Marc Wilhelmus Maria Van Der Wijst, Veldhoven (NL); Koen Jacobus Johannes Maria Zaal, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 91 days.

(21) Appl. No.: 14/762,190

(22) PCT Filed: Dec. 12, 2013

(86) PCT No.: PCT/EP2013/076310
§ 371 (c)(1),
(2) Date: Jul. 20, 2015

(87) PCT Pub. No.: WO2014/114405
PCT Pub. Date: Jul. 31, 2014

(65) Prior Publication Data
US 2015/0323872 A1   Nov. 12, 2015

Related U.S. Application Data

(60) Provisional application No. 61/757,358, filed on Jan. 28, 2013.

(51) Int. Cl.
G03F 7/20 (2006.01)
G02B 7/182 (2006.01)
G02B 26/08 (2006.01)

(52) U.S. Cl.
CPC ............ G03F 7/702 (2013.01); G02B 7/182 (2013.01); G02B 7/1827 (2013.01);
(Continued)

(58) Field of Classification Search
CPC .. G02B 26/0825; G02B 7/182; G02B 7/1827; G03F 7/70158; G03F 7/70191;
(Continued)

(56) References Cited

U.S. PATENT DOCUMENTS 4,679,915 A    7/1987  Kriz et al.
4,993,823 A *  2/1991  Schaffer, Jr. ........... G02B 26/06
                                              359/849

(Continued)

FOREIGN PATENT DOCUMENTS

DE  10 2009 044 462 A    1/2011
EP      0 942 306 A2     9/1999
(Continued)

OTHER PUBLICATIONS

English-Language Abstract for Japanese Patent Publication No. 2007-304254 A, published Nov. 22, 2007; 1 page.
(Continued)

*Primary Examiner* — Deoram Persaud
(74) *Attorney, Agent, or Firm* — Sterne, Kessler, Goldstein & Fox P.L.L.C.

(57) ABSTRACT

Disclosed is a system configured to project a beam of radiation onto a target portion of a substrate within a lithographic apparatus. The system comprises a mirror (510) having an actuator (500) for positioning the mirror and/or configuring the shape of the mirror, the actuator also pro-
(Continued)

viding active damping to the mirror, and a controller (515a, 515b) for generating actuator control signals for control of said actuator(s). A first coordinate system is used for control of said actuator(s) when positioning said mirror and/or configuring the shape of said mirror and a second coordinate system is used for control of said actuator(s) when providing active damping to said mirror.

27 Claims, 9 Drawing Sheets

(52) U.S. Cl.
CPC ......... *G02B 26/0825* (2013.01); *G03F 7/709* (2013.01); *G03F 7/70158* (2013.01); *G03F 7/70191* (2013.01); *G03F 7/70266* (2013.01); *G03F 7/70575* (2013.01)

(58) Field of Classification Search
CPC .. G03F 7/702; G03F 7/70266; G03F 7/70575; G03F 7/709
See application file for complete search history.

(56) References Cited

U.S. PATENT DOCUMENTS

| | | | |
|---|---|---|---|
| 5,016,998 A | 5/1991 | Butler et al. | |
| 6,021,153 A | 2/2000 | Okada | |
| 6,411,426 B1* | 6/2002 | Meehan | G02B 7/1822 310/26 |
| 6,425,671 B1* | 7/2002 | Adler | G02B 26/0825 359/846 |
| 7,837,341 B2 | 11/2010 | Aoki et al. | |
| 7,859,643 B2* | 12/2010 | Asada | G02B 7/1827 355/52 |
| 9,175,948 B2* | 11/2015 | Schoeppach | G03F 7/70266 |
| 2003/0197914 A1 | 10/2003 | Cox et al. | |
| 2003/0234970 A1* | 12/2003 | Phillips | G02B 26/0825 359/291 |
| 2004/0017623 A1* | 1/2004 | Watson | G02B 7/182 359/849 |
| 2004/0027632 A1* | 2/2004 | Watson | G02B 7/1827 359/223.1 |
| 2005/0224687 A1* | 10/2005 | Heertjes | F16F 15/02 248/638 |
| 2006/0232866 A1* | 10/2006 | Sai | G02B 26/0825 359/849 |
| 2006/0245035 A1 | 11/2006 | Uchida et al. | |
| 2007/0076310 A1 | 4/2007 | Sakino et al. | |
| 2007/0280609 A1* | 12/2007 | Ito | G02B 7/003 385/94 |
| 2007/0286035 A1 | 12/2007 | Uchida | |
| 2008/0091756 A1 | 4/2008 | Chouji | |
| 2009/0237793 A1* | 9/2009 | Koo | G02B 27/646 359/555 |
| 2009/0310145 A1 | 12/2009 | Sugiyama et al. | |
| 2011/0235012 A1* | 9/2011 | Fischer | G03F 7/70266 355/67 |
| 2014/0204356 A1* | 7/2014 | Bleidistel | G02B 26/0825 355/71 |

FOREIGN PATENT DOCUMENTS

| | | |
|---|---|---|
| EP | 2 533 078 A1 | 12/2012 |
| JP | 2003-203860 A | 7/2003 |
| JP | 2005-166778 A | 6/2005 |
| JP | 2006-307933 A | 11/2006 |
| JP | 2007-304123 A | 11/2007 |
| JP | 2007-304254 A | 11/2007 |
| JP | 2008-097784 A | 4/2008 |
| JP | 2011-128515 A | 6/2011 |

OTHER PUBLICATIONS

English-Language Abstract for German Patent Publication No. 10 2009 044 462 A1, published Jan. 5, 2011; 1 page.
Wang, P.K.C., et al., "Modal Noninteracting Controls for Deformable Mirrors," Second IEEE Conference on Control Applications, Sep. 13-16, 2003; pp. 121-128.
International Search Report directed to related International Patent Application No. PCT/EP2013/076310, dated Aug. 1, 2014; 9 pages.
International Preliminary Report on Patentability and Written Opinion of the International Searching Authority directed to related International Patent Application No. PCT/EP2013/076310, dated Jul. 28, 2015; 14 pages.
International Search Report and Written Opinion of the International Searching Authority directed to related International Patent Application No. PCT/EP2013/076310, dated Aug. 1, 2014; 22 pages.
International Preliminary Report on Patentability directed to related International Patent Application No. PCT/EP2013/076310, dated Jul. 28, 2015; 14 pages.

* cited by examiner

PROJECTION SYSTEM AND MINOR AND RADIATION SOURCE FOR A LITHOGRAPHIC APPARATUS

CROSS-REFERENCE TO RELATED APPLICATIONS

This application claims the benefit of U.S. provisional application 61/757,358, which was filed on Jan. 28, 2013, and which is incorporated herein in its entirety by reference.

FIELD

The present invention relates to a projection system for a lithographic apparatus and a mirror therefor. The present invention also relates to a lithographic apparatus comprising such a projection system. The present invention relates also to a radiation source for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

Mirrors in EUV projection optics are stiff, mechanically stable elements. The high stiffness results in high eigenfrequencies, which is desirable to obtain a high controller bandwidth. However, in order to counteract the effects of mirror aberrations, which may be caused by lens heating, it is proposed to provide mirrors which can be purposely deformed, the introduced deformations cancelling (at least in part) the effect of the aberrations. Such mirrors need to be more pliant. Such a decrease in stiffness can result in lower eigenfrequencies and hence in a lower bandwidth.

SUMMARY

It is desirable to be able to utilize deformable mirrors in projection optics while maintaining an acceptable controller bandwidth.

The invention in a first aspect provides a projection system configured to project a beam of radiation onto a target portion of a substrate within a lithographic apparatus, said projection system comprising: at least one mirror comprising at least one actuator that is operable to position said mirror and/or configure the shape of said mirror; and to provide active damping to said mirror; at least one controller for generating actuator control signals for control of said actuator(s); wherein a first coordinate system is used for control of said actuator(s) when positioning said mirror and/or configuring the shape of said mirror and a second coordinate system is used for control of said actuator(s) when providing active damping to said mirror.

The invention in a second aspect provides for a projection system comprising a mirror, wherein the shape of said mirror is selected for a particular aberration pattern, so as to maximize the effect of corrective deformations applied by said actuator(s).

The invention in a third aspect provides for a mirror comprising a single deformation actuator for configuring the shape of the mirror, in addition to one or more positional actuators for changing the mirror position, said single deformation actuator being operable on a central area of the back side of the mirror, wherein the mirror has a thicker profile nearer the center than at the edge.

The invention in a fourth aspect provides for a mirror comprising an actuator for configuring the shape of the mirror, wherein said actuator comprises an actuating needle for directly interfacing with said mirror.

The invention in a fifth aspect provides for a radiation source comprising a grating structure operable to suppress the zeroth order of radiation incident thereon for at least first and second component wavelengths; said grating structure having a profile comprising: a first shape configured to cause destructive interference of at least the zeroth order of diffracted radiation for said first component wavelength; and a second shape superimposed upon said first shape and configured to cause destructive interference of at least the zeroth order of diffracted radiation for said second component wavelength The invention in a sixth aspect provides for a radiation source comprising a grating structure operable to suppress the zeroth order of radiation incident thereon for at least a first component wavelength; said grating structure having a periodic profile comprising regularly spaced structures providing three surface levels such that radiation diffracted by said grating structure comprises radiation of three phases which destructively interfere for at least the zeroth order of the diffracted radiation for said first component wavelength.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which.

Figure 1:
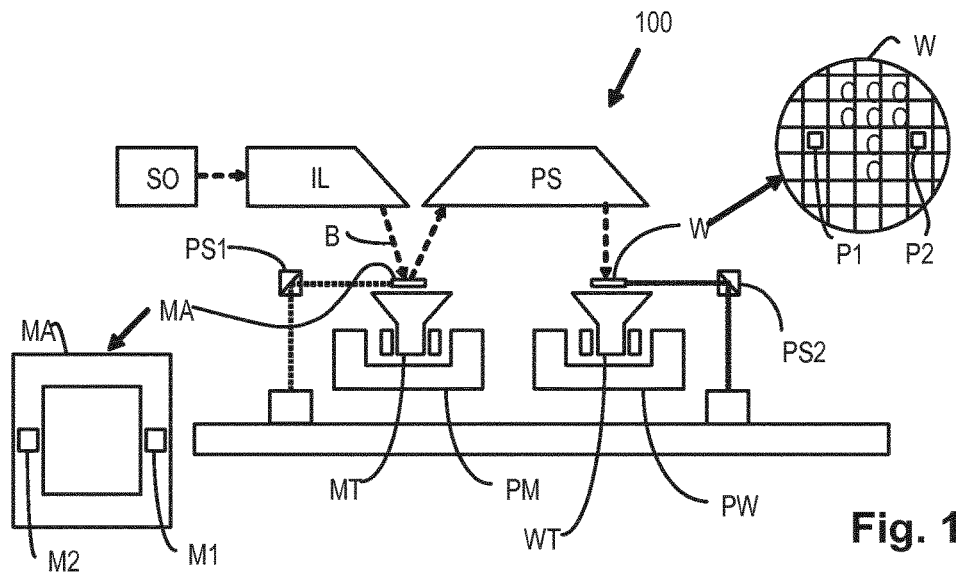
FIG. 1 depicts schematically a lithographic apparatus having reflective projection optics.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF EXEMPLARY EMBODIMENTS

FIG. 1 schematically depicts a lithographic apparatus 100 including a source module SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
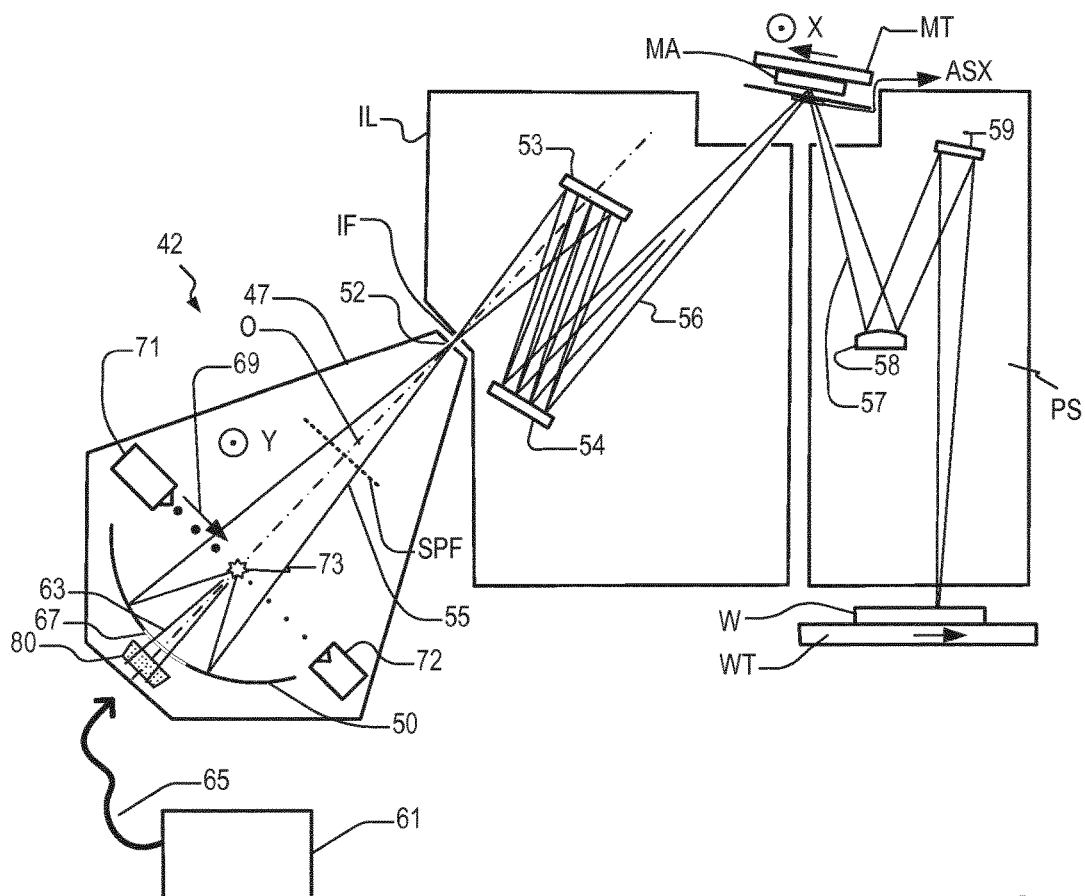
FIG. 2 is a more detailed view of the apparatus of FIG. 1.

FIG. 2 shows an embodiment of the lithographic apparatus in more detail, including a radiation system 42, the illumination system IL, and the projection system PS. The radiation system 42 as shown in FIG. 2 is of the type that uses a laser-produced plasma as a radiation source. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, optical excitation using $CO_2$ laser light. Partial pressures of, for example, 10 Pa of Xe, Li, Sn vapor or any other suitable gas or vapor may be required for efficient generation of the radiation. In an embodiment, Sn is used to create the plasma in order to emit the radiation in the EUV range.

The radiation system 42 embodies the function of source SO in the apparatus of FIG. 1. Radiation system 42 comprises a source chamber 47, in this embodiment not only substantially enclosing a source of EUV radiation, but also collector 50 which, in the example of FIG. 2, is a normal-incidence collector, for instance a multi-layer mirror.

As part of an LPP radiation source, a laser system 61 is constructed and arranged to provide a laser beam 63 which is delivered by a beam delivering system 65 through an aperture 67 provided in the collector 50. Also, the radiation system includes a target material 69, such as Sn or Xe, which is supplied by target material supply 71. The beam delivering system 65, in this embodiment, is arranged to establish a beam path focused substantially upon a desired plasma formation position 73.

In operation, the target material 69, which may also be referred to as fuel, is supplied by the target material supply 71 in the form of droplets. When such a droplet of the target material 69 reaches the plasma formation position 73, the laser beam 63 impinges on the droplet and an EUV radiation-emitting plasma forms inside the source chamber 47. In the case of a pulsed laser, this involves timing the pulse of laser radiation to coincide with the passage of the droplet through the position 73. As mentioned, the fuel may be for example xenon (Xe), tin (Sn) or lithium (Li). These create a highly ionized plasma with electron temperatures of several 10's of eV. Higher energy EUV radiation may be generated with other fuel materials, for example Tb and Gd. The energetic radiation generated during de-excitation and recombination of these ions includes the wanted EUV which is emitted from the plasma at position 73. The plasma formation position 73 and the aperture 52 are located at first and second focal points of collector 50, respectively and the EUV radiation is focused by the normal-incidence collector mirror 50 onto the intermediate focus point IF.

The beam of radiation emanating from the source chamber 47 traverses the illumination system IL via so-called normal incidence reflectors 53, 54, as indicated in FIG. 2 by the radiation beam 56. The normal incidence reflectors direct the beam 56 onto a patterning device (e.g. reticle or mask) positioned on a support (e.g. reticle or mask table) MT. A patterned beam 57 is formed, which is imaged by projection system PS via reflective elements 58, 59 onto a substrate carried by wafer stage or substrate table WT. More elements than shown may generally be present in illumination system IL and projection system PS. For example there may be one, two, three, four or even more reflective elements present than the two elements 58 and 59 shown in FIG. 2. Radiation collectors similar to radiation collector 50 are known from the prior art.

As the skilled reader will know, reference axes X, Y and Z may be defined for measuring and describing the geometry and behavior of the apparatus, its various components, and the radiation beams 55, 56, 57. At each part of the apparatus, a local reference frame of X, Y and Z axes may be defined. The Z axis broadly coincides with the direction of optical axis O at a given point in the system, and is generally normal to the plane of a patterning device (reticle) MA and normal to the plane of substrate W. In the source module (apparatus) 42, the X axis coincides broadly with the direction of fuel stream (69, described below), while the Y axis is orthogonal to that, pointing out of the page as indicated. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

In addition to the wanted EUV radiation, the plasma produces other wavelengths of radiation, for example in the visible, UV and DUV range. There is also IR radiation present from the laser beam 63. The non-EUV wavelengths are not wanted in the illumination system IL and projection system PS and various measures may be deployed to block the non-EUV radiation. As schematically depicted in FIG. 2, a transmissive SPF may be applied upstream of the virtual source point IF. Alternatively or in addition to such a filter, filtering functions can be integrated into other optics. For example a diffractive filter can be integrated in collector 50 and/or mirrors 53, 54 etc., by provision of a grating structure tuned to divert the longer, IR radiation away from the virtual source point IF. Filters for IR, DUV and other unwanted wavelengths may thus be provided at one or more locations along the paths of beams 55, 56, 57, within source module (radiation system 42), the illumination system IL and/or projection system PS.

To deliver the fuel, which for example is liquid tin, a droplet generator or target material supply 71 is arranged within the source chamber 47, to fire a stream of droplets towards the plasma formation position 73. In operation, laser beam 63 may be delivered in a synchronism with the operation of target material supply 71, to deliver impulses of radiation to turn each fuel droplet into a plasma. The frequency of delivery of droplets may be several kilohertz, or even several tens or hundreds of kilohertz. In practice, laser beam 63 may be delivered by a laser system 61 in at least two pulses: a pre pulse PP with limited energy is delivered to the droplet before it reaches the plasma location, in order to vaporize the fuel material into a small cloud, and then a main pulse MP of laser energy is delivered to the cloud at the desired location, to generate the plasma. In a typical example, the diameter of the plasma is about 2-3 mm. A trap 72 is provided on the opposite side of the enclosing structure 47, to capture fuel that is not, for whatever reason, turned into plasma.

Laser system 61 in may be for example of the MOPA (Master Oscillator Power Amplifier) type. Such a laser system 61 includes a "master" laser or "seed" laser, followed by a power amplifier system PA, for firing a main pulse of laser energy towards an expanded droplet cloud, and a pre pulse laser for firing a pre pulse of laser energy towards a droplet. A beam delivery system 24 is provided to deliver the laser energy 63 into the source chamber 47. In practice, the pre-pulse element of the laser energy may be delivered by a separate laser. Laser system 61, target material supply 71 and other components can be controlled by a controller (not shown separately. The controller performs many control functions, and has sensor inputs and control outputs for various elements of the system. Sensors may be located in and around the elements of radiation system 42, and optionally elsewhere in the lithographic apparatus. In some embodiments of the present invention, the main pulse and the pre pulse are derived from a same laser. In other embodiment of the present invention, the main pulse and the pre-pulse are derived from different lasers which are independent from each other but controlled to operate synchronously. A problem that can arise in the LPP source apparatus is that optical elements of the laser beam deliver system 65 will become contaminated with debris from the plasma. In particular a final optical element, be it a lens or a mirror, is directly exposed to particles of fuel ejected from the plasma. A refractive (transmissive) element will quickly become obscured by tin deposits, leading to reduced transmission of the laser radiation and undesired heating. A reflective final element, such as a copper mirror, may be more tolerant of Sn deposits for time, but will need cleaning eventually to maintain efficiency of reflection and focusing.

In order to block as much contamination as possible, a contamination trap 80 of some sort may be provided between the plasma formation site 73 and optical elements of the beam delivery system 65. A so-called foil trap is known for use in such cases. The trap may be a static or a rotating foil trap, or a combination of both. The rotating foil trap (RFT), as is known in the art, comprises a number of thin vanes aligned with the radiation direction so as to present as little obstruction to the wanted radiation beam. The vanes extend in length parallel to the beam direction, and extend radially from the optical axis (O). When the foils rotate about the optical axis O, slower-moving contaminant particles are caught by the sweeping motion of the vanes. Unfortunately, the foil trap itself constitutes some obstruction to the beam, resulting in loss of radiation power delivered to the plasma formation position 73. The radiation absorbed by the trap leads to heating, consequently distortion of the trap and radiation from it. Consequently, the RFT may not be effective in maintaining overall performance of the apparatus. Other types of trap, for example those based on counter-flowing gas, are deployed instead (e.g. low pressure nitrogen). These other types of trap are not necessarily so effective at stopping the debris.

Figure 3:
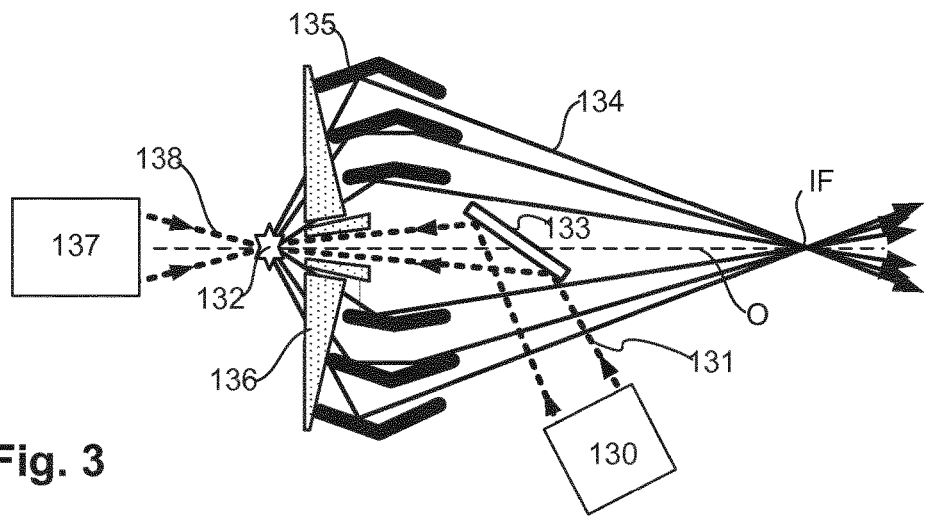
FIG. 3 shows an alternative source arrangement usable in the apparatus of FIG. 2.

FIG. 3 shows an alternative LPP source arrangement which may be used in place of that illustrated in FIG. 2. A main difference is that the main pulse laser beam is directed onto the fuel droplet from the direction of the intermediate focus point IF, such that the collected EUV radiation is that which is emitted generally in the direction from which the main laser pulse was received.

FIG. 3 shows the main laser beam delivery system 130 emitting a main pulse beam 131 delivered to a plasma formation position 132. At least one optical element of the beam delivery system, in this case a folding mirror 133 is located on the optical axis between plasma position 132 and the intermediate focus. (The term "folding" here refers to folding of the beam, not folding of the mirror.) The EUV radiation 134 emitted by a plasma at position 132, or at least the major portion that is not directed back along the optical axis O into the folding mirror 133 is collected by a grazing incidence collector 135. This type of collector is known already, but is generally used in discharge produced plasma (DPP) sources, not LPP sources. Also shown is a debris trap 136. A pre-pulse laser 137 is provided to deliver a pre-pulse laser beam 138 to fuel droplets. In this example, the pre-pulse energy is delivered to the side of the fuel droplet that faces away from the intermediate focus point IF. It should be understood that the elements shown in this schematic diagram are not to scale.

Figure 4:
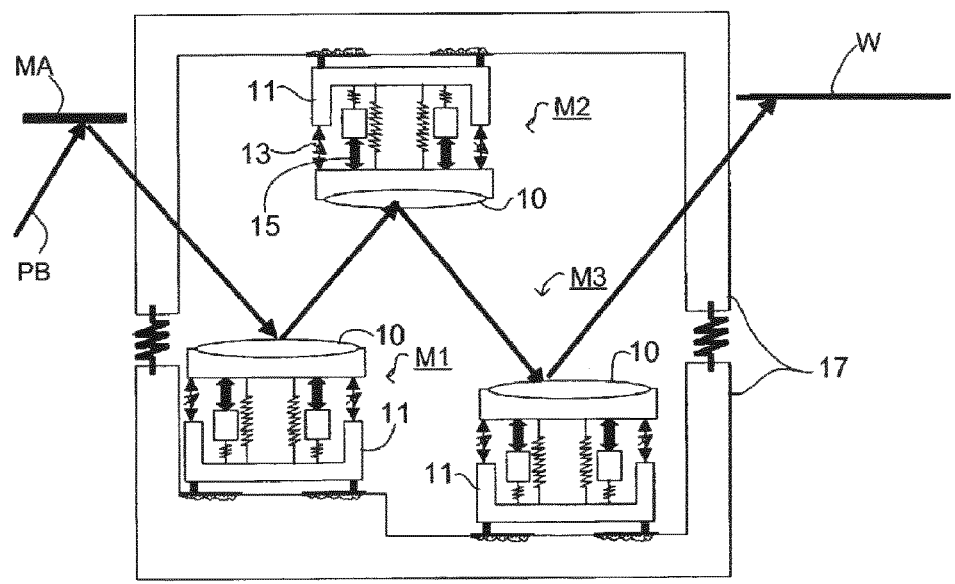
FIG. 4 shows a projection optics arrangement.

The projection system is shown, by way of example, in FIG. 4 as three reflective mirrors mounted in an optical system frame. In an apparatus, the projection system may comprise more, e.g. four or six, mirrors each mounted in the manner shown in FIG. 4. The mirrors M1, M2, and M3, are mounted to a frame 17 via respective positioning systems that are preferably capable of positioning the mirrors 10 accurately in six degrees of freedom. For a sub-nanometer position accuracy the position loops that control each mirror should have a high servo bandwidth (>200 Hz), which is physically limited by the mechanical eigenfrequencies seen in the servo loop. The mirror itself is relatively compact, with relatively simple mechanics and high stiffness, so the dynamics can be designed with high internal mechanical eigenfrequencies (e.g. >2000 Hz), required for the high controller servo bandwidth. Actuators 15 drive each mirror 10, so as to selectively position it. The positioning actuators 15 may be Lorenz-force motors. A servo feedback element, such as a position sensor 13, may be used to measure the position of the element with respect to the optical system sub-frame 11. Depending on the requirements of the control system the position sensors 13 may be used to determine the relative displacement, velocity and/or accelerations of the mirror 10.

The accuracy of the positioning of mirrors 10 may be affected by vibrations and other positional noise within the projection system and the projection system frame. The positional noise may, for example, be created by influences external to the projection system (such as acoustic noise, residual floor vibrations and scan reaction forces transmitted via the vibration isolation or suspension system between the base frame and the projection optics system) and by internal influences such as the reaction forces of the actuators used to adjust the position of the projection system elements. One way of compensating for at least some of these vibrations is active damping of mirror eigenfrequencies.

To counteract the effect of mirror aberrations, such as those resultant from lens induced heating, it is desirable to make the mirrors deformable. By doing this, cancelling deformations can be purposely introduced so as to cancel for mirror aberrations. This naturally results in a need to make the mirrors less stiff. However, a decrease in stiffness results in lower eigenfrequencies and hence in a lower servo bandwidth.

The decreased stiffness of the mirror necessitates a reduced servo bandwidth if the amount of sensors and actuators remains the same. A higher bandwidth could be obtained by increasing the number of sensors and actuators, by applying, for example, modal control. However, there are only a feasible number of physical devices which can be attached to a mirror, and physically connecting an actuator induces a certain amount of aberration, so minimizing the number of actuators is favorable. Therefore it is proposed to use the same actuators and/or sensors for modal control as used for mirror positioning and deformation control.

Figure 5:
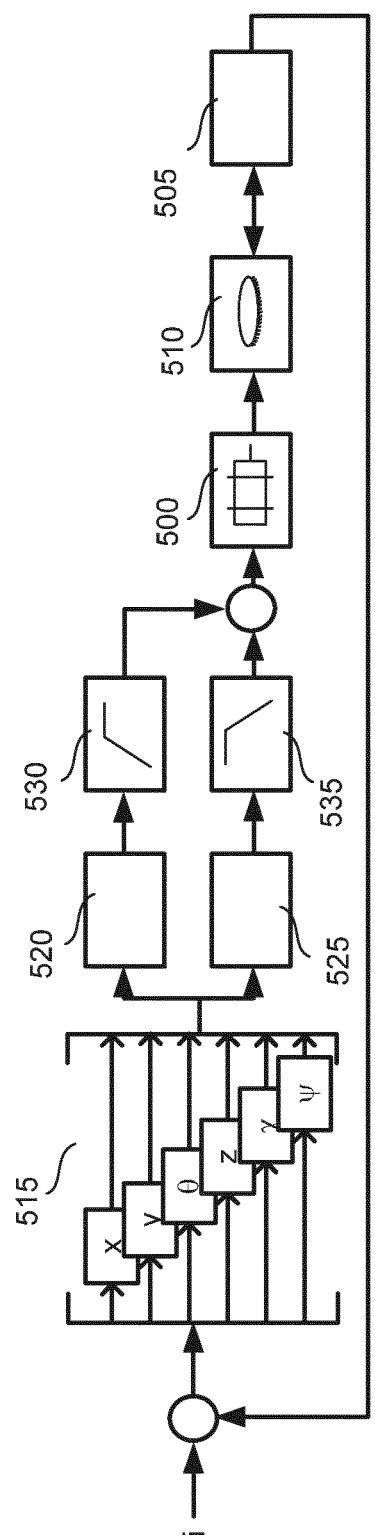
FIG. 5 is a first system control diagram illustrating an embodiment of the invention.

FIG. 5 shows a system control diagram for a first embodiment of the invention. Shown are actuators 500 and/or sensors 505 which are used for mirror 510 positioning and deformation and for active damping of resonant modes. For mirror positioning and deformation, a specific coordinate system is required, for example a Zernike coordinate system comprising 6 rigid-body positions and a number of Zernike polynomials (low frequency signals). For active damping, a different coordinate system is required, for example comprising modal coordinates (high frequency signals). By switching in the frequency domain between two possible decoupling matrices, control in both coordinate systems can be achieved simultaneously.

Shown are a number of controllers 515 for controlling both the mirror 510 position and deformation (e.g. 6 rigid body and N Zernike controllers) and the active damping (e.g. 6+N modal shape controllers). N is determined by the required mirror deformation and number of modes that need to be actively damped. N equals the number of additional actuators/sensors. The controllers receive as input i, the setpoint position and Zernike coordinates from higher-level machine software, combined with a feedback signal from the sensors 505. The control signals output from the controllers are separately fed into a Modal decoupling matrix 520 and into a Zernike decoupling matrix 525. The output from the Modal decoupling matrix 520 is passed through high-pass filter 530 as its output is only valid for high-frequency signals. Following this, the filtered signals are then fed to the actuators 500 for controlling mirror 510 damping. The output from the Zernike decoupling matrix 525 is passed through low-pass filter 535 as its output is only valid for low-frequency signals. Following this, the filtered signals are then fed to the actuators 500 for controlling mirror 510 positioning and deformation.

Figure 6:
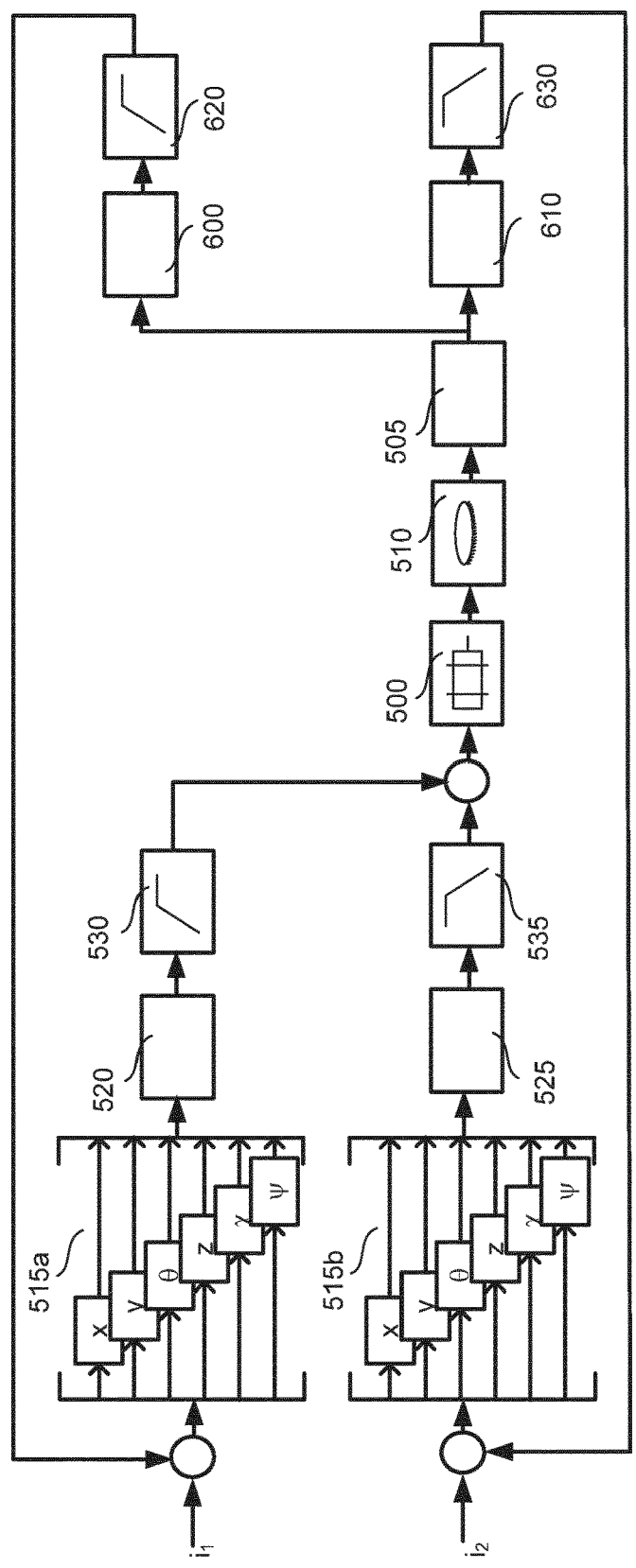
FIG. 6 is a second system control diagram illustrating an embodiment of the invention.

FIG. 6 shows a variation on the arrangement of FIG. 5. In this example the sensor 505 measurements are also subject to a frequency split, with the measured Modal positions decoupled from the measured Zernike positions. To obtain the modal position signals, the sensor 505 signals are fed through a modal decoupling matrix 600 and then through high pass filter 620. These modal position signals are fed back to dedicated Modal controllers 515a for control of active damping, where they are combined with system input $i_1$ (which may be zero). Similarly, to obtain the Zernike position signals, sensor 505 signals are converted by decoupling matrix 610 into signals describing rigid-body positions and deformations of the mirror, and are passed through low pass filter 630. These Zernike position signals are fed back to dedicated rigid body/Zernike controllers 515b for control mirror position and deformation, where they are combined with system input $i_2$ (as created by higher level software). In this way dedicated controllers can be used for the two control regimes Using the sensors/actuators needed for mirror deformation, for active damping of resonant modes enables a high position control bandwidth and hence a low image position error.

Figure 7:
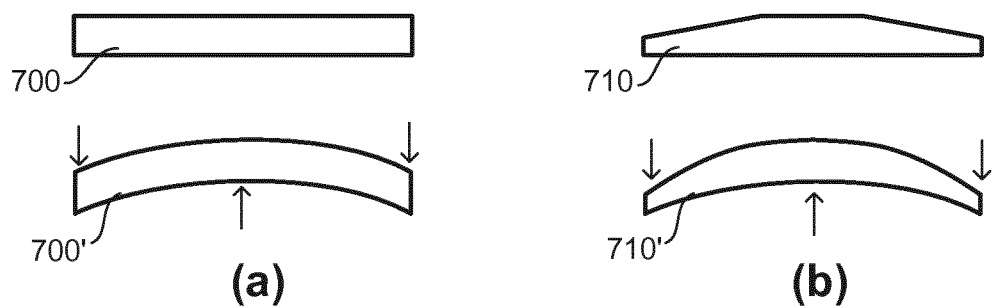
FIG. 7 shows (a) a planar mirror before and after deformation by a single actuator and (b) a mirror according to an embodiment of the invention, before and after deformation by a single actuator.

To minimize the number of actuators required to achieve a specific form of deformation, it is proposed to adjust the shape of one or more of the mirrors. For example, as illustrated in FIG. 7, by reshaping the mirror such that it has a more triangular or trapezoid shape, only a single deformation actuator (that is an additional actuator dedicated to mirror deforming, in addition to the positional actuators) is required to create a deformation which is steeper at the edges than in the center. FIG. 7 shows a planar mirror (a) before 700 and after 700' deformation by a single deformation actuator acting upon the backside of the mirror, and a part-trapezoid mirror (b) before 710 and after 710' deformation by a single deformation actuator acting upon the backside of the mirror. The other forces at the mirror periphery are provided by the mirror's positional actuators. Mirror shapes can be selected which enable the most efficient actuation of a specific form using a single deformation actuator (or a minimal number of actuators); for example for efficient correction of specific Zernike forms, or the most occurring general mirror deformation(s).

Figure 8:
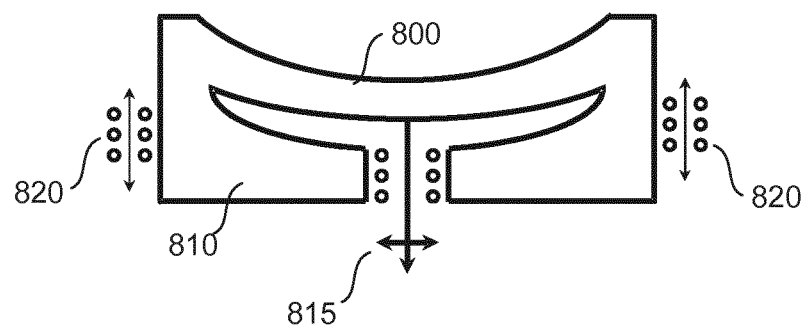
FIG. 8 shows a mirror arrangement according to a further embodiment of the invention.

When only a single deformation actuator is being used, acting on a central position of the backside of a positive mirror, the thickness shape of the mirror may be chosen such that the resulting deformation from the single force results in the desired shape, and not only in a central dent. FIG. 8 illustrates such a configuration. It shows a mirror 800 in a mirror frame 810, the mirror having a thicker profile nearer the central actuator than at the edge, and a specific shape to ensure that the deformation matches the desired deformation when only a single actuator is used. A deformation actuator is represented by arrows 815, the action of which (in combination with the mirror profile), causes the mirror to be curved in the X and Y dimensions. Also shown is the positional actuator 820 (e.g. 6-degree-of-freedom (6dof) Lorentz motor) for mirror positioning.

To prevent low frequencies of the actuator limiting the bandwidth of the 6dof positional actuators, the deformation actuator perpendicular to the mirror surface may be supported by two actuators parallel to the mirror surface, each with a sensor and a (e.g. proportional-integral-differential PID) controller. In addition, the main deformational actuator may have a sensor and a controller, as normally used with Lorentz motors. All the controllers may include active damping in the derivative action (D-action) from the PID controller, as normally used for Lorentz motors. Measurement of the internal deformation may be done using internal sensors, different from the 6dof position sensors, and can therefore use a different co-ordinate system.

Figure 9:
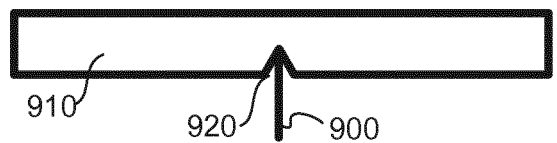
FIG. 9 shows an actuator arrangement according to an embodiment of the invention.

To reduce undesired mirror deformations, a minimum number of actuators are preferably connected to the mirror. For example, a mirror may comprise three inserts, with a 2-D actuator connected to each insert. Adding more actuators in a similar manner is undesirable because of induced lens aberrations. FIG. 9 illustrates a type of actuator 900, hereinafter referred to as a "needle" actuator, which is not connected to the mirror 910 by means of an insert, but interfaces directly to the mirror material. The needle actuator 900 can be very pliant in non-actuating directions, because it only applies a small force and hence only needs a small actuator unit. No specific measures are required in the mirror itself, except for the provision of a notch 920 in the mirror material. In an embodiment, the needle actuator can only push and hence needs to be pre-stressed.]

LPP EUV sources can have a high infrared (IR) content in its output, largely from the IR radiation emitted by the laser used to excite the fuel, which is reflected back off the fuel droplet and towards the collector. This IR content should be removed as much as possible from the source output to prevent wafer heating and optics (over)heating, leading to overlay errors.

Figure 10:
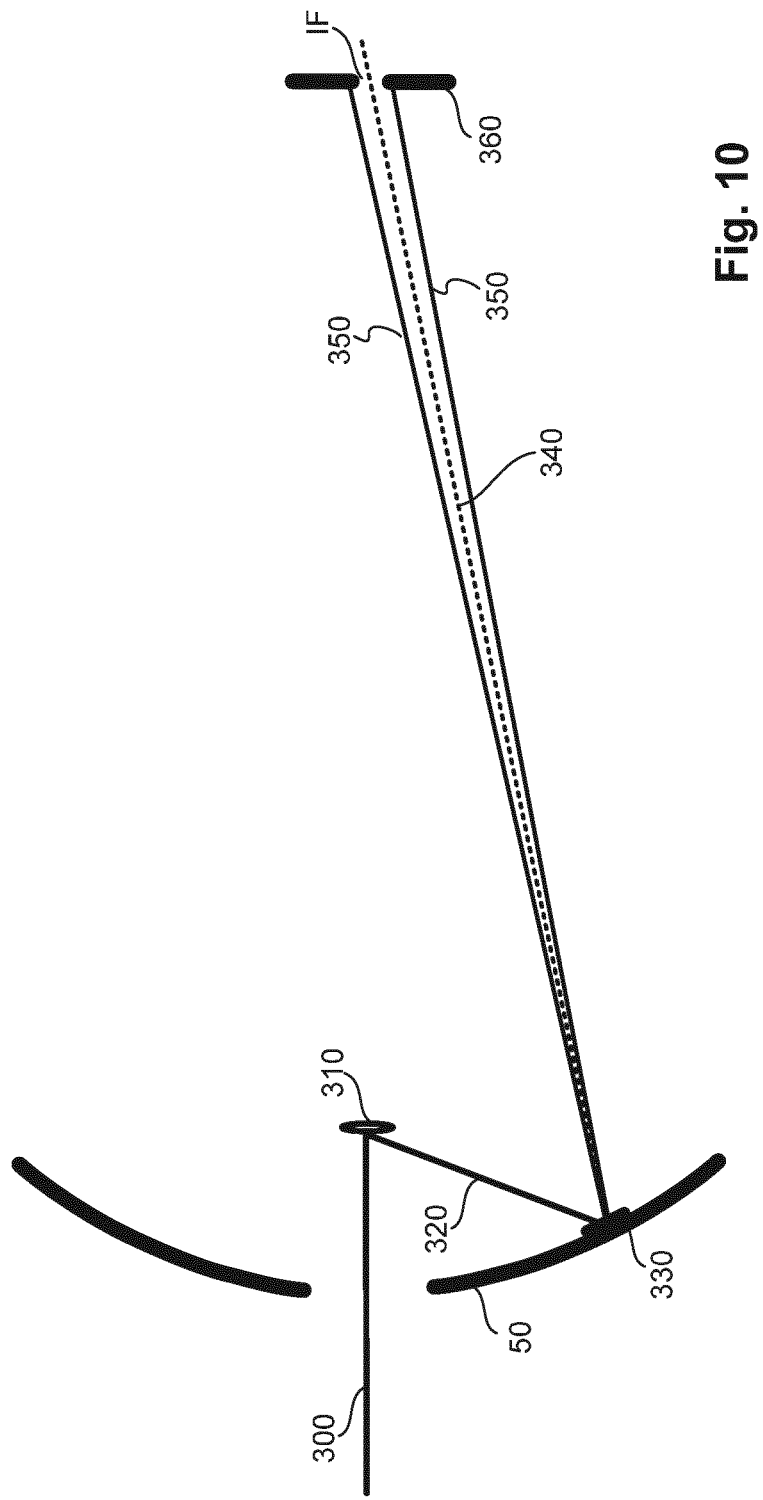
FIG. 10 shows an EUV source arrangement illustrating the function of a collector SPF.

This issue is illustrated schematically in FIG. 10. This shows an IR laser beam 300 incident on a fuel droplet 310. Some IR radiation 320 is reflected back towards collector 50. IR filtering may be realized by provision of a grating 330 integrated into the collector 50 surface (sometimes referred to as a 'spectral purity filter (SPF) collector'). This grating 330 is tuned to cancel zeroth order reflected radiation 340 (shown dotted as this is essentially suppressed by the filter 330) for the driving IR wavelength of 10.6 µm. First order reflected radiation 350 (and other orders) can then be blocked by a cap 360 at or near the intermediate focus (IF).

This zeroth order cancellation is specific to a single specific wavelength, and is not effective against secondary lines. This means that secondary IR lines are not suppressed effectively, and so need to be removed in the IR laser or delivery system. This limitation limits net IR output from the laser system by effectively preventing the use of multiple $CO_2$ output lines.

Some current $CO_2$ IR-lasers output a strong secondary line of wavelength 9.6 µm, in addition to the main 10.6 µm line. The use of this line could increase overall output by over 10%. The use of multiple output lines would also mean that no/less wavelength filtering needed and that there would be less level transition bottlenecking.

The suppression grating on the collector uses the basic principle of destructive interference whereby each contribution from the top areas of the grating is canceled by an out-of-phase equal contribution from the bottom areas. This equates to equal areas for top and bottom (Duty Cycle DC=50%), and a grating depth of λ/4 (or more generally λ/4+n*/2).

Figure 11:
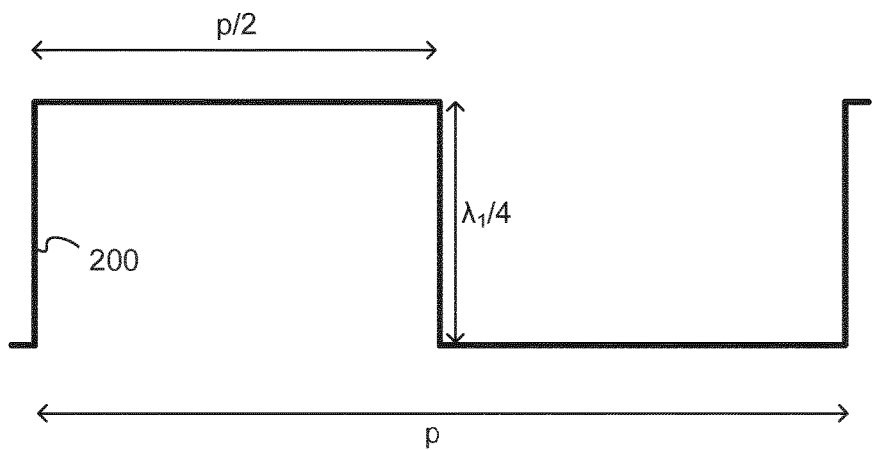
FIG. 11 shows a grating profile for suppression of zeroth order diffracted radiation of wavelength $\lambda_1$.

FIG. 11 shows the simplest profile 200 which satisfies these conditions. p representing the grating pitch (which may be, by way of example, 1000 µm), and $\lambda_1$ is the wavelength to be suppressed by the grating (for example 10.6 µm). As can be seen profile 200 represents a binary (square wave) structure having a grating depth of $\lambda_1/4$ (e.g. 2.65 µm).

It is proposed to extend this basic layout by adding a further shape to the structure of FIG. 10, such that the shape added is identical for both the top and bottom parts of the grating. In this way, for every contribution there is still an equal contribution 180 degrees out-of-phase.

One implementation may be the addition of a step-wise grating with half the pitch p2=p/2, superimposed on the grating with basic pitch p. Equivalently, another implementation may be to superimpose a step-wise grating with a double pitch p2'=2*p onto the original grating with pitch p.

Figure 12:
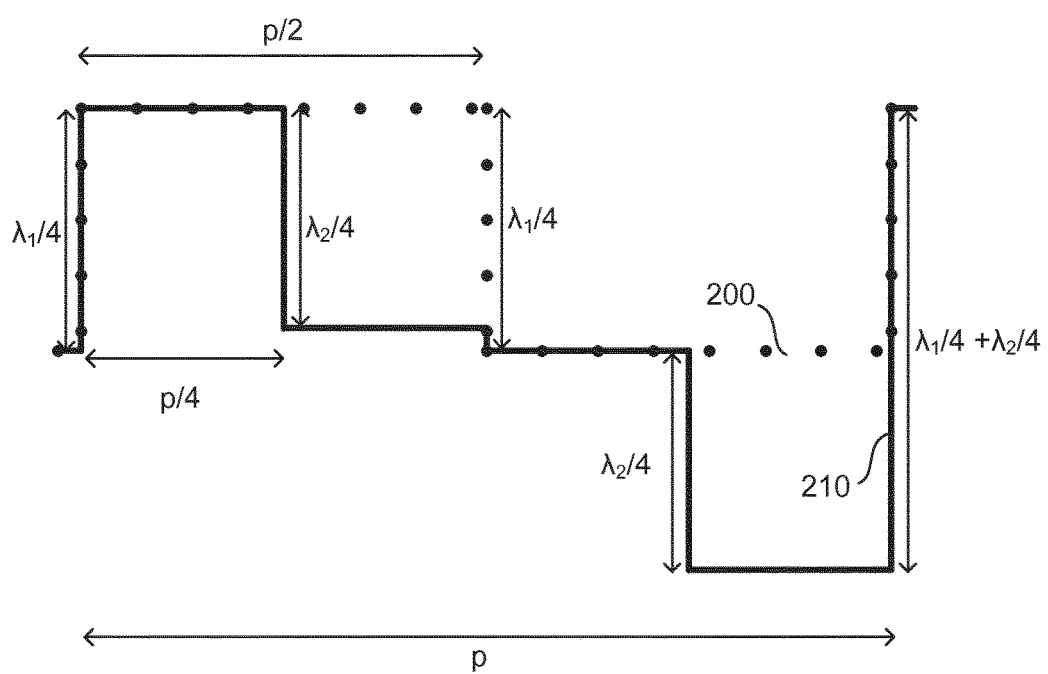
FIG. 12 shows a grating profile according to an embodiment of the invention for suppression of zeroth order diffracted radiation of wavelength $\lambda_1$ and wavelength $\lambda_2$.

FIG. 12 shows the profile 210 of the latter of these implementations. Again, p represents the (main) grating pitch, and $\lambda_1$ is the main wavelength to be suppressed by the grating (for example 10.6 μm). $\lambda_2$ is the secondary wavelength to be suppressed by the grating (for example 9.6 μm). The profile 210 is shown superimposed on the profile 200 of FIG. 11 for illustration (here shown dotted). On each of the top and bottom parts of the grating a step has been added having a depth of $\lambda_2/4$ (which may be 2.4 μm for the aforementioned example) to meet the condition for destructive interference of this secondary wavelength.

The FIG. 12 profile may be preferable to the example comprising the addition of a step-wise grating with half the pitch p2=p/2, superimposed on the grating with basic pitch p, as this means that suppression of the main wavelength (10.6 μm) is least compromised. A larger pitch means IR radiation is diffracted at a lesser angle and heat load is more concentrated close to the spatial filter or aperture; thus it is preferable that the strongest wavelength has the smaller pitch.

This concept can be further generalized to include gratings of any arbitrary shape, as long as this shape is equal for both the top and bottom profiles. Thus, this step shape can be designed for any desired secondary characteristic while maintaining primary suppression.

In fact, this generalization can be taken even one step further where both top and bottom shapes are freeform, as long as the basic destructive interference condition is met ('for every contribution there must be an equal contribution 180 degrees out of phase').

This principle can also be extended in a straightforward way to suppress three or more wavelengths (although in practice this will be limited by pitch and edge loss considerations: every additional wavelength requires a doubling of the pitch, plus additional edges). This may be useful for example where the optimum wavelength and/or laser type might be significantly different for pre-pulse than for main pulse (for example a Nd-YAG laser outputting at 1 μm for pre-pulse, and the aforementioned $CO_2$ laser outputting at both 10.6 μm and 9.6 μm for the main pulse). Power for pre-pulse should also be limited if the collector grating 330 is tuned only for the wavelength(s) of main pulse.

For the particular example where a dual-line IR main pulse (having closely spaced wavelengths) and a separate pre-pulse wavelength (having a wavelength approximately 10 times shorter), the concepts described herein can be combined with more conventional depth optimization where grating depth is chosen to suppress both long and short wavelengths. As already mentioned, there will be destructive interference when the depth satisfies the equation $\lambda/4+n*\lambda/2$, and therefore the same depth can satisfy two different wavelengths by varying n. In this specific example, a depth of 2.65 μm should suppress 1 μm wavelength radiation to a reasonable degree, in addition to 10.6 μm radiation. In one embodiment, both grating depths (that is the depth of the main grating, and that of the grating superimposed on the main grating) are chosen to suppress both main pulse and pre-pulse contributions.

The $\lambda/4$ grating relies on producing two signals of equal strength (from two equally wide surface areas) and of opposite phase (surface vertical position differing by $\lambda/4$), so as to cancel out the zero order. A convenient representation is the complex plane. Each planar element, of width $w_k$ and depth $z_k$, is represented by a point $p_k$ such that:

$$p_k = w_k e^{i\varphi_k}; \text{ where}$$

$$\varphi_k = \frac{4\pi z_k}{\lambda}.$$

The requirement that the zero order vanishes is where $\Sigma p_k = 0$. The $\lambda/4$ grating is represented by two opposite points, $p_1 = -p_2$.

Such $\lambda/4$ gratings, as described above, are effective at strongly suppressing the zeroth order reflection. However, the grating reflects 40% of the incident power in the two first orders. As can be seen in FIG. 10, the first orders are intercepted by the IF cap 360 where this power is dissipated.

If the laser power is concentrated at a hotspot on the collector 50, as may be the case for a MOPA-PP drive lase, two hotspots on the IF cap 360 will occur, each comprising about 40% of power transmitted by the collector. This heat load may therefore exceed the maximum specification of the IF cap 360 and cause mechanical damage at high power level and high duty cycle.

It is therefore proposed to use a triple phase $\lambda/6$ grating as collector grating 330 instead of a $\lambda/4$ grating. This grating suppresses the zero order equally well, while reducing the reflected first order radiation to 23% of incident power, as compared to 40% for a $\lambda/4$ grating. The first order hot spot power is therefore reduced by close to a factor of 2, reducing the risk of damage to the IF cap 360.

Figure 13:
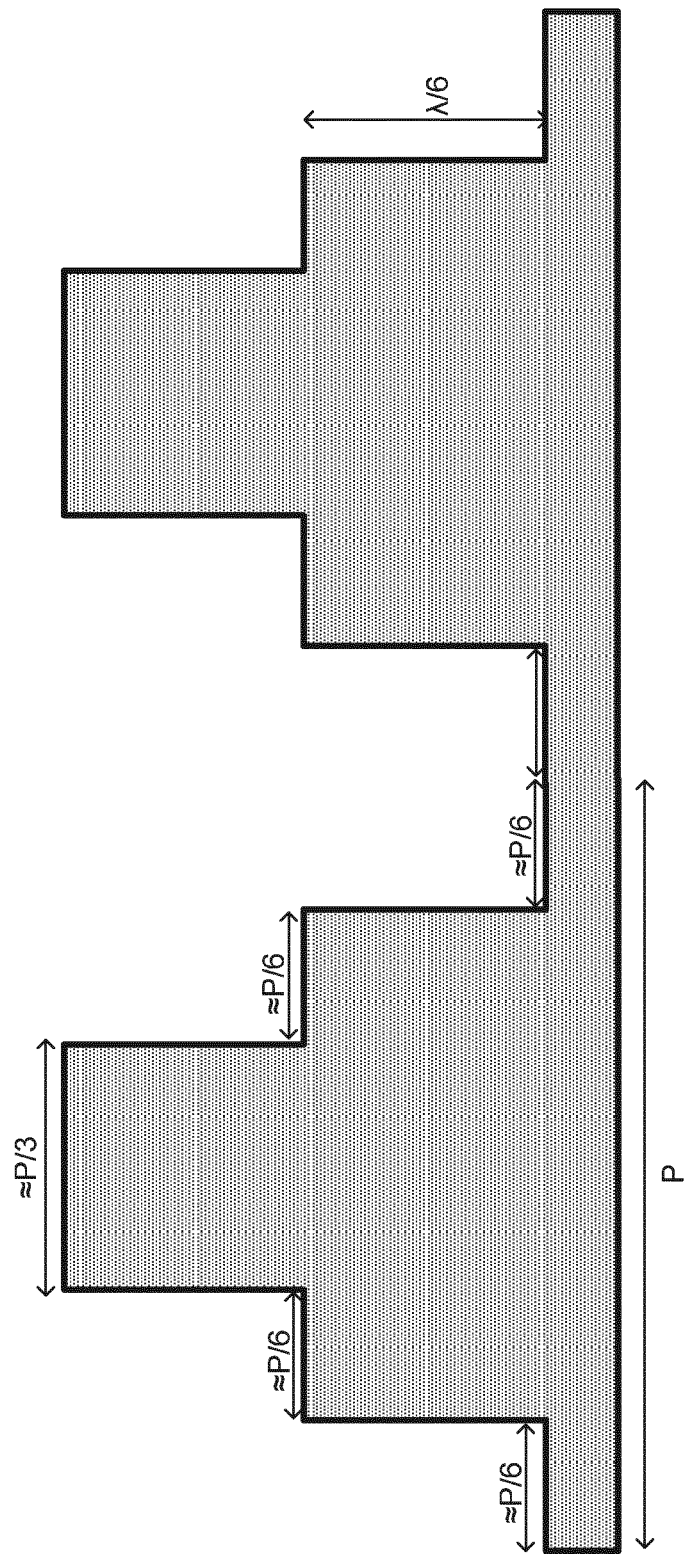
FIG. 13 shows part of a grating profile according to an embodiment of the invention for suppression of zeroth order diffracted radiation of wavelength $\lambda_1$ with improved suppression of first order diffracted radiation of wavelength $\lambda_1$.

FIG. 13 shows a cross section of one of the structures making up such a grating. The grating has a depth of $\lambda/6$ between a lower profile of the grating and an intermediate profile, where $\lambda$ is again the wavelength of the incident radiation.

The $\lambda/6$ grating is the simplest generalization of grating after the $\lambda/4$ grating. Where it has three approximately equal surfaces as illustrated in FIG. 13, it can be represented as an equilateral triangle centered at the origin in the complex plane. In the three phase solution the widths of the levels may differ, as long the height differences are chosen such that $\Sigma p_k = 0$. For the triple phase grating there are 6 parameters $w_k$ and $\varphi_k$. Taking into account that one of the phases, e.g. $\varphi_2$, can be set to zero, then:

$$\Sigma_{k=1}^{3} w_k = p \text{ and } \Sigma_{k=1}^{3} p_k = 0 \text{ (real and imaginary parts)}$$

and 2 independent parameters are left. By choosing $w_1 = w_3$ this can be reduced to a single free parameter, $w_2$, which can be optimized for the desired ratio between first and second orders using a Kirchhoff grating approximation or a standard electromagnetic code.

Figure 14:
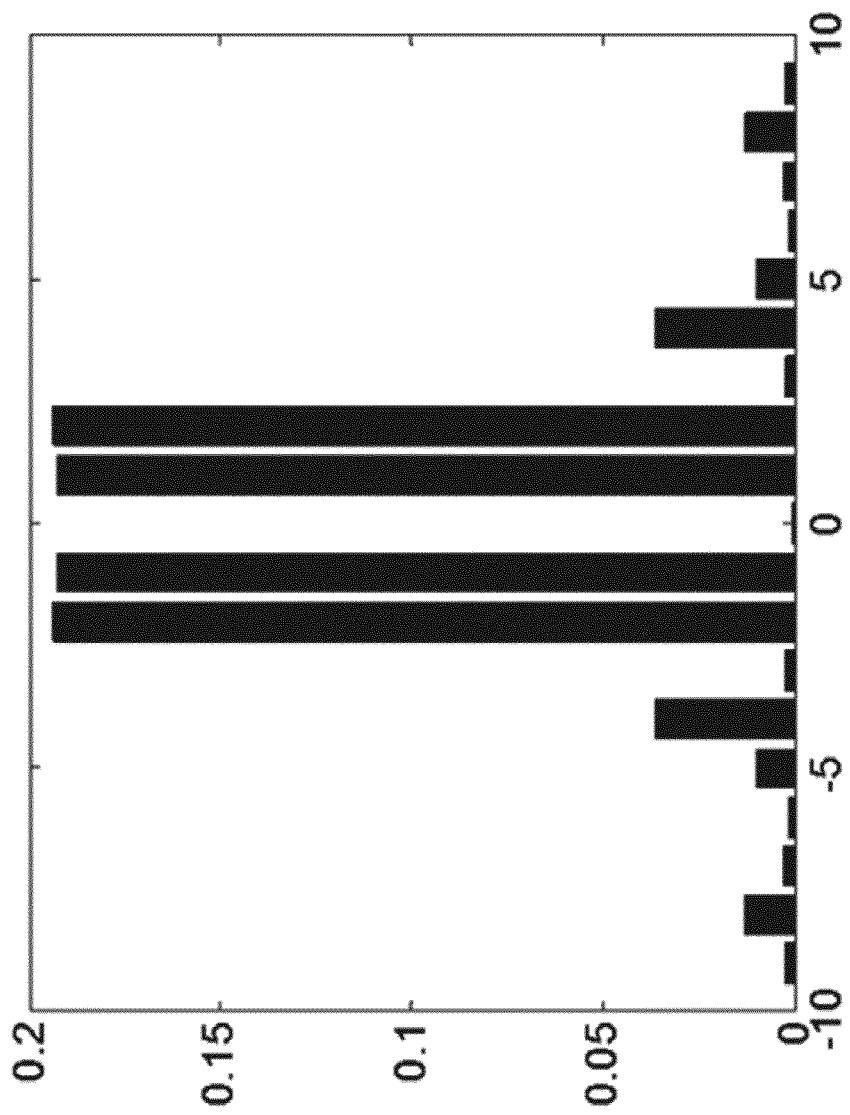
FIG. 14 is a graph of diffraction efficiency against diffraction order for a grating profile of the type illustrated in FIG. 13.

FIG. 14 shows, by way of example, a diffraction pattern obtained from a dual wave grating of pitch P illuminated with light of wavelength $\lambda = 10.6$ μm, with a rigorous coupled-wave analysis (RCWA) code, for:

$$w_1 = w_3 = w = 0.321 P$$

$$w_2 = P - 2w,$$

where diffraction efficiency is on the y-axis and diffraction order is on the x axis.

The overall height of the structure varies depending on the choice of the widths and phases. It is larger than for the $\lambda/4$ grating and maximally $\lambda/3$. In this way the first and second orders can be further optimized and made approximately equal in intensity.

This concept can be generalized to any number of phase levels. It is possible to combine this concept with that described in relation to FIG. 12 by doubling the number of phase levels.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A projection system configured to project a beam of radiation onto a target portion of a substrate within a lithographic apparatus, the projection system comprising:
   a mirror comprising an actuator configured to position the mirror and/or configure a shape of the mirror, and to provide active damping to the mirror;
   a controller configured to generate actuator control signals for controlling the actuator; and
   a low pass filter and a high pass filter configured to separately filter the generated actuator control signals,
   wherein the generated actuator control signals are decoupled, depending upon a frequency of the actuator control signals, into first actuator control signals for controlling the actuator when positioning the mirror and/or configuring the shape of the mirror and second actuator control signals for controlling the actuator when providing active damping to the mirror.

2. The projection system of claim 1, wherein a first coordinate system is used for controlling the actuator when positioning the mirror and/or configuring the shape of the mirror and a second coordinate system is used for controlling the actuator when providing active damping to the mirror.

3. The projection system of claim 2, wherein first and second decoupling matrices are used respectively to obtain the first actuator control signals and the second actuator control signals.

4. The projection system of claim 3, wherein the low pass filter is configured to filter an output of the first decoupling matrix and the high pass filter is configured to filter an output of the second decoupling matrix.

5. The projection system of claim 2, wherein the first coordinate system is a Zernike coordinate system.

6. The projection system of claim 2, wherein the second coordinate system is a modal coordinate system.

7. The projection system of claim 2, wherein the mirror comprises at least one sensor for providing a feedback signal, the feedback signal being used to provide negative feedback for the first actuator control signals and the second actuator control signals.

8. The projection system of claim 7, wherein one or more first controllers are configured to generate the first actuator control signals and one or more second controllers are configured to generate the second actuator control signals and the projection system further comprising:
   a sensor configured to generate a first feedback signal according to the first coordinate system, for use by the one or more first controllers, and to generate a second feedback signal according to the second coordinate system, for use by the one or more second controllers.

9. The projection system of claim 1, wherein the mirror comprises a reflective surface with a steeper profile nearer to a periphery of the mirror in comparison to its center.

10. The projection system of claim 1, wherein a shape of the mirror is selected for a particular aberration pattern, so as to maximize an effect of corrective deformations applied by the actuator.

11. The projection system of claim 1, further comprising:
   a single deformation actuator configured to configure a shape of the mirror; and
   one or more positional actuators configured to change a position of the mirror,
   wherein the single deformation actuator is configured to operate on a central area of a back side of the mirror,
   wherein the mirror comprises a thicker profile nearer the central area than at an edge, and
   wherein the single deformation actuator is perpendicular to a mirror surface and the single deformation actuator is supported by two further actuators parallel to the mirror surface.

12. The projection system of claim 11, wherein the mirror has a shape configured to ensure that a deformation matches a desired deformation when the single deformation actuator is used.

13. The projection system of claim 11, wherein each further actuator comprises a sensor and a controller.

14. The projection system of claim 13, wherein the single deformation actuator comprises a sensor and a controller.

15. The projection system of claim 1, wherein the actuator comprises an actuating needle for directly interfacing with the mirror.

16. The projection system of claim 15, wherein the actuating needle interfaces with the mirror via an indent in mirror material.

17. The projection system of claim 15, wherein the actuating needle is configured to operate in only one dimension.

18. The projection system of claim 1, further comprising:
   one or more additional mirrors, wherein each mirror comprises a plurality of actuators, each actuator being configured to position its respective mirror, configure a shape of its respective mirror and to provide active damping to its respective mirror.

19. A mirror comprising:
   a single deformation actuator configured to configure a shape of the mirror; and one or more positional actuators configured to change the mirror position, wherein the single deformation actuator is configured to operate on a central area of a back side of the mirror, wherein the mirror has a thicker profile nearer the central area than at an edge, and wherein the single deformation actuator is perpendicular to a mirror surface and the single deformation actuator is supported by two further actuators parallel to the mirror surface.

20. The mirror of claim 19, wherein the mirror comprises a shape configured to ensure that a deformation matches a desired deformation when the single deformation actuator is used.

21. The mirror of claim 19, wherein each further actuator comprises a sensor and a controller.

22. The mirror of claim 21, wherein the single deformation actuator comprises a sensor and a controller.

23. A projection system comprising:
a mirror comprising:
a single deformation actuator configured to configure a shape of the mirror; and
one or more positional actuators configured to change a position of the mirror,
wherein the single deformation actuator is configured to operate on a central area of a back side of the mirror,
wherein the mirror has a thicker profile nearer the central area than at an edge, and
wherein the single deformation actuator is perpendicular to a mirror surface and the single deformation actuator is supported by two further actuators parallel to the mirror surface, each further actuator comprising a sensor and a controller.

24. A lithographic apparatus comprising:
a projection system configured to project a beam of radiation onto a target portion of a substrate within a lithographic apparatus, the projection system comprising:
a mirror comprising an actuator configured to position the mirror and/or to configure a shape of the mirror and to provide active damping to the mirror;
a controller configured to generate actuator control signals for controlling the actuator; and
a low pass filter and a high pass filter configured to separately filter the generated actuator control signals,
wherein the generated actuator control signals are decoupled, depending upon a frequency of the actuator control signals, into first actuator control signals for controlling the actuator when positioning the mirror and/or configuring the shape of the mirror and second actuator control signals for controlling the actuator when providing active damping to the mirror.

25. A projection system configured to project a beam of radiation onto a target portion of a substrate within a lithographic apparatus, the projection system comprising:
a mirror comprising an actuator configured to position the mirror and/or configure a shape of the mirror, and to provide active damping to the mirror;
a first controller configured to generate first actuator control signals in a first coordinate system for controlling the actuator when positioning the mirror and/or configuring the shape of the mirror;
a second controller configured to generate second actuator control signals in a second coordinate system, different than the first coordinate system, for controlling the actuator when providing active damping to the mirror;
a first decoupling matrix configured to receive the first actuator control signals;
a second decoupling matrix configured to receive the second actuator control signals;
a high pass filter configured to filter first actuator control signals from the first decoupling matrix; and
a low pass filter configured to filter second actuator control signals from the second decoupling matrix,
wherein the filtered first and second actuator control signals are configured to provide control to the actuator in both first and second coordinate systems simultaneously.

26. The projection system of claim 25, wherein the first coordinate system is a modal coordinate system configured for high frequency signals, and the second coordinate system is a Zernike coordinate system configured for low frequency signals.

27. The projection system of claim 26, further comprising:
a sensor coupled to the mirror and configured to output sensor measurement signals;
a second high pass filter configured to filter sensor measurement signals from a third decoupling matrix; and
a second low pass filter configured to filter sensor measurement signals from a fourth decoupling matrix.

* * * * *